US009111523B2

(12) United States Patent
Gautama

(10) Patent No.: US 9,111,523 B2
(45) Date of Patent: Aug. 18, 2015

(54) DEVICE FOR AND A METHOD OF PROCESSING A SIGNAL

(75) Inventor: Temujin Gautama, Boutersem (BE)

(73) Assignee: NXP B.V., Eindhoven (NL)

( * ) Notice: Subject to any disclaimer, the term of this patent is extended or adjusted under 35 U.S.C. 154(b) by 551 days.

(21) Appl. No.: 12/972,468

(22) Filed: Dec. 18, 2010

(65) Prior Publication Data

US 2011/0150233 A1 Jun. 23, 2011

(30) Foreign Application Priority Data

Dec. 18, 2009 (EP) .................................... 09180022

(51) Int. Cl.

| | |
|---|---|
| ***G10K 11/16*** | (2006.01) |
| ***H03B 29/00*** | (2006.01) |
| ***G10K 11/178*** | (2006.01) |
| *H04R 1/10* | (2006.01) |
| *H04R 5/033* | (2006.01) |

(52) U.S. Cl.

CPC .......... *G10K 11/1782* (2013.01); *H04R 1/1083* (2013.01); *H04R 5/033* (2013.01)

(58) Field of Classification Search

CPC ............ G10K 11/1782; G10K 11/178; G10K 11/175; H04R 1/1083; H04R 5/033

USPC ......... 381/71.6, 71.8–71.12, 71.3, 71.2, 73.1, 381/71.9, 71.11, 71.1, 122, 74

See application file for complete search history.

(56) References Cited

U.S. PATENT DOCUMENTS

| | | | |
|---|---|---|---|
| 5,138,664 A | 8/1992 | Kimura et al. | |
| 5,477,534 A * | 12/1995 | Kusano | 370/286 |
| 5,852,667 A | 12/1998 | Pan et al. | |
| 2006/0262935 A1 * | 11/2006 | Goose et al. | 381/17 |

FOREIGN PATENT DOCUMENTS

| | | |
|---|---|---|
| CN | 101176382 A | 5/2008 |
| JP | 07-143600 A | 6/1995 |
| JP | 2005-072703 A | 3/2005 |
| JP | 2005-354683 A | 12/2005 |
| JP | 2006-248353 A | 9/2006 |
| JP | 2006-267174 A | 10/2006 |
| JP | 2007-166478 A | 6/2007 |

(Continued)

OTHER PUBLICATIONS

Kuo, S. et al. "Active Noise Control: A Tutorial Review," Proc. of the IEEE, vol. 87, No. 6, pp. 943-973 (Jun. 1999).

(Continued)

*Primary Examiner* — Vivian Chin
*Assistant Examiner* — Con P Tran

(57) ABSTRACT

A device (100) for processing a signal, wherein the device (100) comprises a processing unit (101) comprising an input terminal and two output terminals, wherein the processing unit is adapted for receiving a signal (104) at the input terminal, and wherein the processing unit is adapted for generating a reduction, signal based on the signal, wherein the reduction signal is adapted for reducing the signal. The device comprises further a first reproduction unit (102) coupled to the first output terminal of the processing unit, wherein the first reproduction unit is adapted for receiving and reproducing the signal, and a second reproduction unit (103) coupled to the second output terminal of the processing unit, wherein the second reproduction unit is adapted for receiving and reproducing the reduction signal.

13 Claims, 1 Drawing Sheet

(56) References Cited

FOREIGN PATENT DOCUMENTS

| | | | | | |
|---|---|---|---|---|---|
| WO | 2008/133490 | A2 | | 11/2008 | |
| WO | WO 2008133490 | A2 | * | 11/2008 | ........... G10K 11/178 |

OTHER PUBLICATIONS

Extended European Search Report for European Patent Appln. No. 09180022.7 (Apr. 23, 2010).

* cited by examiner

DEVICE FOR AND A METHOD OF PROCESSING A SIGNAL

CROSS-REFERENCE TO RELATED APPLICATIONS

This application claims priority under 35 U.S.C. §119 of European patent application no. 09180022.7, filed on Dec. 18, 2009, the contents of which are incorporated by reference herein.

FIELD OF THE INVENTION

The invention relates to a device for processing a signal. Beyond this, the invention relates to a method of processing a signal. Moreover, the invention relates to a program element. Furthermore, the invention relates to a computer-readable medium.

BACKGROUND OF THE INVENTION

The use of Active Noise Reduction (ANR) headphones, which isolates the user from the ambient sound (for instance car/aircraft engine noise, fan noise, train/metro) by means of anti-sound played through the headphone loudspeakers is growing. In conventional headphones, the anti-sound is calculated from microphones placed on the headphone.

There exist a wide variety of active noise reduction (ANR) systems for headsets. Conventional feed forward active noise reduction systems pick up a "reference noise" signal, and play a filtered version of this reference signal such that it reduces the noise perceived by the user of the headset. The filtering can be performed in the analog domain, of in the digital domain. Due to the fact that the reference noise is registered using a microphone, the filtering is performed on all the ambient noise and the consequent reduction is non-selective.

OBJECT AND SUMMARY OF THE INVENTION

It is an object of the invention to provide a system which is capable of efficiently and selectively reducing noise.

In order to achieve the object defined above, a device for processing a signal, a method of processing a signal, a program element and a computer-recallable medium according to the independent claims are provided.

According to an exemplary embodiment of the invention, a device for processing a signal (which may be an audio data signal) is provided, wherein the device comprises a processing unit comprising an input terminal and two output terminals, wherein the processing unit is adapted for receiving the signal at the input terminal. The device comprises further a first reproduction unit coupled to the first output terminal of the processing unit, wherein the first reproduction unit is adapted far receiving and reproducing the signal (for example as acoustic waves), and a second reproduction unit coupled to the second output terminal of the processing unit, wherein, the second reproduction unit is adapted for receiving and reproducing a reduction signal (for instance as acoustic waves). The processing unit is further, adapted for generating a reduction signal based on the signal at the input terminal, wherein the reduction signal is adapted for reducing the signal generated or reproduced by the second reproduction unit (for instance by way of destructive interferences).

According to a further exemplary embodiment of the invention, a method of processing a signal is provided, the method comprising receiving a signal at an input of a processing unit, receiving the signal by a first reproduction unit from a first output of the processing unit and reproducing the signal by the first reproduction unit, generating a reduction signal based on the signal in the processing unit, wherein the reduction signal is adapted for reducing the signal, generated or reproduced by the first reproduction unit, receiving the reduction signal by a second reproduction unit from a second output of the processing unit, and reproducing the reduction signal by the second reproduction unit.

According to still another, exemplary embodiment of the invention, a program element (for instance a software routine, in source code or in executable code) is provided, which, when being executed by a processor, is adapted to control or carry out a signal processing method having the above mentioned features.

According to yet another exemplary embodiment of the invention, a computer-readable medium (for instance a CD, a DVD, a USB stick, a floppy disk or a hard disk) is provided, in which a computer program is stored which, when being executed by a processor, is adapted to control or carry out a signal processing method having the above mentioned features.

Signal processing for signal reproduction correction purposes which may be performed according to embodiments of the invention can be realized by a computer program, that is by software, or by using one or more special electronic optimization circuits, that is in hardware, or in hybrid form, that is by means of software components and hardware components.

There exist a wide variety of active noise reduction (ANR) systems for headsets. Conventional feed forward active noise reduction systems pick up a "reference noise" signal, and play a filtered version of this reference signal such that it reduces the noise perceived by the user of the headset. The filtering can be performed in the analog domain, or in the digital domain. In the latter case, better ANR performance can be achieved because very complex filters can be used, and furthermore, the filters can, be made adaptive to possible changes in acoustics (e.g., if the fitting of the headset is different). However, a major issue in digital ANR implementations is the delay from the digital-to-analog (DAC) and analog- to-digital conversions (ADC). Indeed, it can be shown that the performance of digital ANR systems degrades considerably in the presence of delays. The analog solutions use less complex filters, due to which the ANR performance is lower than what could be expected from a digital solution in the absence of delays, but the filtering is almost instantaneous (as it is an analog electronic circuit). In a number of special cases, the reference signal of the undesired interference may be known (in digital format), and may even be shifted in time (e.g., loud music for the passengers while driving the car). In those cases, ANR systems may be used to reduce the perceived sound level of this interference signal in a selective manner (for instance, the perceived sound level of the music can be lowered for the driver, such that he/she can concentrate on the traffic), while retaining the other sounds that are present. Very good ANR performance may be expected from a digital system, since the delay from the ADC and DAC, which typically deteriorate the ANR performance of a digital system, may be compensated for example by buffering (delaying) the reference signal prior to sending it to the first reproduction system (assuming this buffering can be controlled on the first reproduction system). This embodiment may introduce such system for active reduction of interferences, where the source of the interference (reference signal) is known, and the delay of the system generating the interference may be controlled.

The device according to this embodiment may increase the level of comfort for the user by greatly reducing interferences, for example acoustical, of which the source signals are known and may be accessed. This may be desirable in a great number of scenarios, for example:

the driver in a car needs to be able to focus his/her attention to the road and the traffic sounds, even when the passenger(s) want to hear loud music;

people who want to have a conversation in a room where others are listening to loud music that is played on a stereo or television;

people who want to listen to their own music (using a headset) in a morn where loud music is playing on a stereo or television: rather than increasing the volume of the desired music, the perceived volume of the undesired music can be decreased);

in parties, where a DJ mixes one song after the other, the DJ wants to cancel the music that is currently playing in the room in order to listen to, and properly adjust the next song;

in a place where public radio is playing: the device can be tuned to the same station, thereby creating its own digital source of the interference.

The term "reducing" may denote not only reducing but also canceling the signal. In an ideal case, the signal (which may be a noise of the environment) may be completely canceled. By reproducing the reduction (or cancellation) signal and the signal at the same time, the signal may be canceled cancelled by the reduction signal for the user, to whom both signals are provided.

The signal may be an interference signal. The signal may be a known signal from a known source. The signal may be of any kind, for example audio data signal. When the signal is reproduced by the reproduction units, the reproduction units may convert the signal into any kind of physical signal like acoustical waves.

The processing unit and the first and second reproducing units may be formed as a single unit or may be formed as separate units, wherein parts of the different units may also be arranged as a part of another unit.

In the following, further exemplary embodiments of the device will be explained. However, these embodiments also apply to the method, to the computer-readable medium and to the program element.

The first and the second reproduction units may be audio reproduction units. The term "audio reproduction unit" may particularly denote an entity capable of converting electronic audio data into corresponding acoustic waves perceivable by an ear of a human listener having attached the audio reproduction unit. Hence, an audio reproduction unit may be a loudspeaker which tray, for instance, be integrated in an earpiece for selective and spatially limited playback of audio data. An audio reproduction unit may also be a loudspeaker or an amplifier which may be, for instance, be coupled to an audio signal source like a CD player.

The signal may be a digital signal. The digital signal may be in particular an audio data signal. The term. "audio data" may particularly denote any audio piece which is to be reproduced by an audio reproduction device, particularly the loudspeaker of the device. Such audio content may include audio information stored on a storage device such as a CD, a DVD or a hard disk or may be broadcasted by a television or radio station or via a communication network such as the public Internet or a telecommunication network. It may be a movie sound, a music song, speech, an audio book, sound of a computer game or the like.

The processing unit may comprise a delay unit for delaying the signal before providing the signal to the first reproduction unit. With this embodiment, it may be ensured that both signals are reproduced simultaneously for achieving a good cancellation of the undesired signal.

The delay unit may comprise a buffer for storing the signal. The signal may be stored for a specific duration. The specific duration may be sufficient to generate the reduction signal so that both signals may be reproduced simultaneously.

The processing unit may be adapted for Active Noise Reduction. An embodiment can be realized in a particularly simple and efficient manner using an Active Noise Reduction (ANR). In an ANR system implemented according to an exemplary embodiment, a noise-cancellation speaker may emit a sound wave with the same amplitude but with inverted phase to the original sound. The waves combine to form a new wave, in a process called interference, and effectively cancel each other out by phase cancellation. The resulting sound wave may be so faint as to be inaudible to human eats. The transducer emitting the cancellation signal may be located at the location where sound attenuation is wanted (for instance the user's cars). In an embodiment, the first reproduction unit and the second reproduction unit may be adapted for Active Noise Reduction. Active Noise Reduction (ANR) headsets may reduce the exposure to ambient noise by playing so-called "anti-noise" through headset loudspeakers. In conventional systems, the ambient noise is picked up by a microphone, filtered and phase-reversed with an ANR filter, and sent back to the loudspeaker. In case of a feed forward ANR, the microphone may be arranged outside the ear cup. In case of a feedback ANR, the microphone may be arranged inside the eat cup. According to the invention, ANR is performed by the processing unit in combination with the first and the second reproduction unit. However, other embodiments of the invention may be implemented in others than Active Noise Reduction system.

The processing unit may be adapted for receiving the signal via a wireless link. Thus, the device may also be used in situations where the undesired interference, i.e. the signal, is available via a wireless link. For instance, it may be used for a sound reproduction system that transmits the signal or reference signal.

Exemplary applications of exemplary embodiments of the invention are entertainment systems for a car, congress systems including headphones for translation or interpretation, in-flight entertainment systems, etc. The first reproduction unit may form part of a speaker and an amplifier. The second reproduction unit may form part of a headset, a headphone or an earphone. Other applications are possible as well. Embodiments may be particularly applied to all environments where a listener, wearing headphones is surrounded by fixed signal sources.

For instance, the device according to the invention may be realized as one of the group consisting of a mobile phone, a hearing aid, a television device, a video recorder, a monitor, a gaming device, a laptop, an audio player, a DVD player, a CD player, a hard 43*k*-based media player, a radio device, an Internet radio device, a public entertainment device, an MP3 player, a car entertainment device, a medical communication system, a body-worn device, a speech communication device, a home cinema system, a home theater system, a flat television apparatus, an ambiance creation device, a studio recording system, or a music hall system. However, these applications are only exemplary, and other applications in many fields of the art are possible.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to exemplary embodiments to which the invention is not limited.

DESCRIPTION OF EMBODIMENTS

Figure 1:
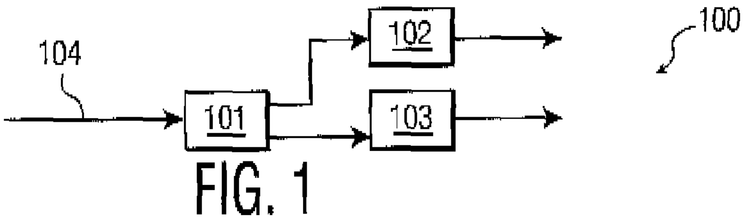
FIG. 1 illustrates a device of processing a signal according to an exemplary embodiment of the invention.

The illustration in the drawing is schematic. In different drawings, similar or identical elements are provided with the same reference signs.

FIG. 1 illustrates a device 100 for processing a signal according to an exemplary embodiment of the invention. The de-vice 100 for processing a signal comprises a processing unit 101, a first reproduction unit 102 and a second reproduction unit 103. The processing unit 101 comprises an input terminal and two output terminals. The processing unit 101 receives via the input terminal a signal 104. The signal 104 may be for example, an audio data signal. The first reproduction unit 102 is coupled to the first output terminal of the processing unit 101. The first reproduction unit 102 is adapted for receiving and reproducing the signal. The processing unit 101 generates a reduction signal based on the signal 104, wherein the reduction signal is adapted for reducing the signal 104, for example, through destructive interferences. The second reproduction unit 103 is coupled to the second output terminal of the processing unit 101 and is adapted for receiving and reproducing the reduction signal.

Figure 2:
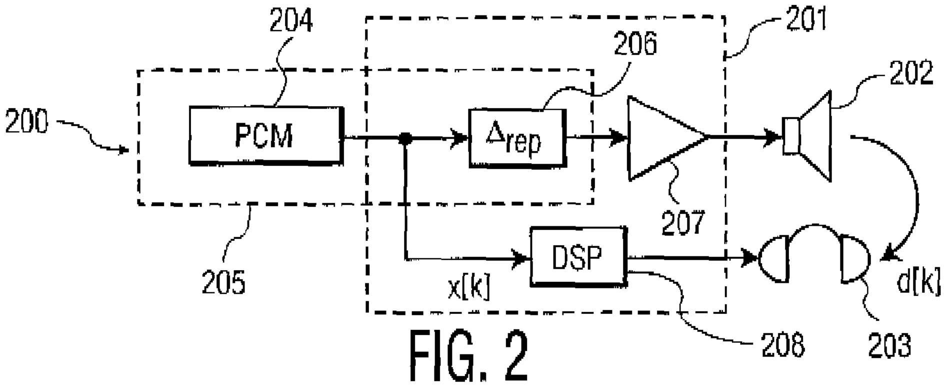
FIG. 2 illustrates a system of processing a signal according to an exemplary embodiment of the invention.

FIG. 2 illustrates a system 200 of processing a signal according to an exemplary embodiment of the invention. The system 200 comprises a headset 203, for example, with, stereo speakers and built-in inner microphones (one in each earpiece). The system 200 comprises further a processing unit 201 comprising a DSP (digital signal processing) unit 208 to perform the processing of the signal. The system 20D comprises further a sound reproduction device 205 (such as a DVD or MP3 player, or a car radio) which is modified such that there are two signal paths, one with the normal (small) delay (path through the processing unit 201 to the second reproduction unit 203) and the other with a (larger) delay (path through the processing unit 201 via a delay unit 206 and an amplifier 207 to the second reproduction unit 202) that can be controlled (additional delay $\Delta_{rep}$ (delta rep)). The 'normally' delayed signal is sent to the DSP 208 of the processing unit 201 where it is processed and sent subsequently to the headset 203, while the delayed version is sent to the amplifier (207) and speakers representing the second reproduction unit 202 (in FIG. 2, only a single speaker is shown, but this can be a set of speakers). It is important that the reference signal (that is to be acoustically reduced for the headset user), is obtained by the DSP 208 before it is played by the reproduction system 202.

The system may require a digital representation of the reference (and for the user, undesired) signal, for instance provided via a PCM 204 (pulse code modulator) that needs to be canceled (before it is sent to the amplifier 207 and speakers 202). This signal will be processed through the DSP 208 and sent to the headset 203 of the user. The obtained result will be that the user will, perceive the reference (undesired) signal at least at a much lower sound level.

Figure 3:
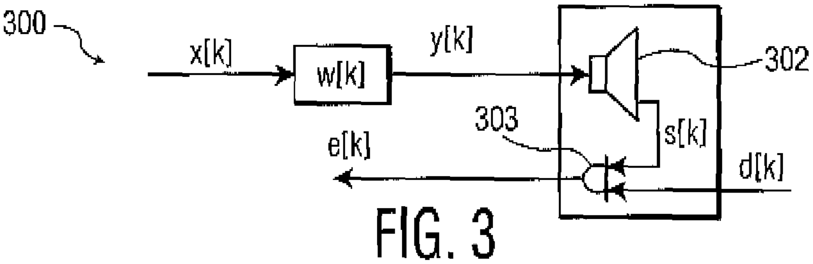
FIG. 3 shows a part of the system illustrated in FIG. 2.

The basic setup for the active reduction of a known interference is shown for one side of the headset 203 (left or right) in FIG. 3. The reference signal x[k] (i.e., the output of the block PCM 204 in FIG. 2) is filtered by a digital filter, w[k], which yields the cancellation signal, y[k]. This signal is acoustically filtered by the path between loudspeaker and inner microphone, which is commonly referred to as the secondary path slab and is acoustically summed with the ambient noise d[k] to form the error signal e[k]. In the embodiment, the ambient noise, d[k], has an undesired component that originates from the reference signal (a delayed version of which is played by the sound reproduction system, see 202 in FIG. 1). In conventional active noise reduction systems, the reference signal, x[k], is a signal recorded by an external "reference microphone", and not a known interference as in the current case. This is also the reason why, in the present system, the active reduction is selective, and only reduces the known interference, while retaining the other sounds. The digital filter, w[k], should be determined, in such a way that the signal power in the inner microphone is minimized. This way, the cancellation signal will be, after acoustical filtering by the secondary path, s[k], roughly in counterphase to the undesired interference in d[k], and as a result, the undesired interference (e.g., music) will be greatly reduced in the error microphone, while keeping the other sounds (e.g., traffic sounds) intact. The signal picked up by the error microphone is assumed to be close to what the user perceives, as it is located close to the user's ear. The method used for determining the filter coefficients, w[k], is not a part of the proposed invention, since traditional methods, such as well-known filter techniques can be used.

In the general case, several reference signals can be available (e.g., a stereo or surround signal, in which case the filtering operation consists of the sum of a number of digital filters, each of which receives a separate input (e.g., one of the channels). A simulation illustrates the expected performance of the system. A headset that is commercially available has been used for recording a number of signals (at a sampling rate of 48 kHz) and is mounted on a head-and-torso simulator (HATS), which simulates a human user wearing the headset. The secondary path, s[k], is determined by playing a white noise signal on the loudspeaker and estimating the acoustical path between this noise signal and the signal recorded on the error microphone. Next, a piece of music, which is used as the reference signal, x[k], is played via four loudspeakers that are positioned in the corners of the room, and the signal is recorded on the error microphone and on the artificial ear on the HATS. The reference signal (the music in digital format that is sent to the four loudspeakers) is used in combination with the signals recorded on the error microphone to estimate the digital FIR filter w[k] (with a length of 4096 taps). The performance can now be evaluated in terms of a gain, which is the dB ratio per frequency between the signal with active reduction and without active reduction of the known interference. The gain can be computed using the secondary path, which would yield the performance evaluated on the error microphone:

$$\mathrm{gain}(w)[\mathrm{dB}] = 10\log_{10} P_w(d + s * w * x) / P_w(d)$$

where * denotes convolution, and $P_\omega$ denotes the power spectral density at frequency ω. Negative values correspond to a reduction of the signal power (which is desired). However, to evaluate the effect that would be perceived by the user, the recordings made using the artificial ear can be used instead of e, in combination with tertiary path, t[x], i.e., the acoustical path between headset loudspeaker and artificial eat of the HATS, instead of the secondary path, s[k]. The performance, expressed in terms of the gain, then corresponds to what is expected to be perceived by a normal user, and is typically slightly worse than when evaluated on the error microphone.

Figure 4:
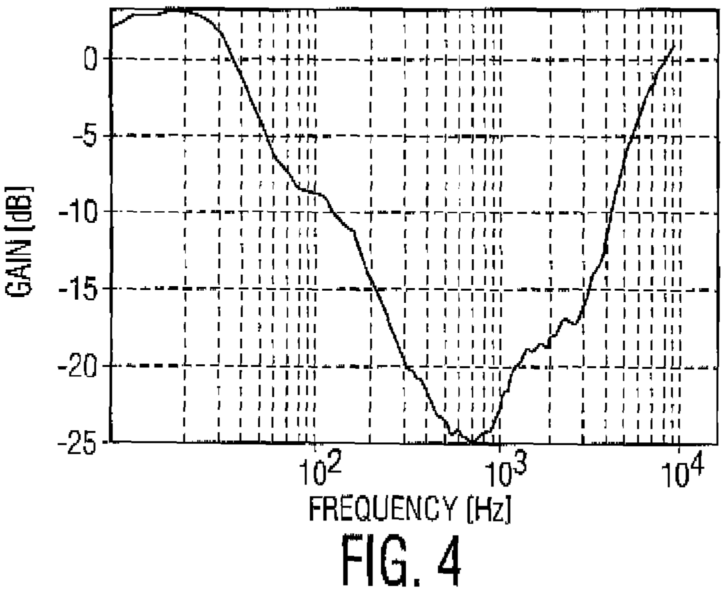
FIG. 4 shows a diagram of a gain (in dB) of a system according to an exemplary embodiment of the invention.

FIG. 4 shows the performance evaluated on the artificial ear. It can be observed that in a frequency region between 150 Hz and 4000 Hz, the gain is below −10 dB (reduction of the interference of higher than 10 dB), and it is below −15 dB for the frequency region between 200 Hz and 3000 Hz. The deepest reduction is approximately 25 dB. Note that in this simulation study, there has been no delay compensation, as it was unnecessary. However, in a real system, the reproduction of the cancellation signal has a delay (from the DAC), in which case, the delay of the sound reproduction system ($\Delta_{rep}$ in FIG. 2) should be at least equal to this DAC delay.

The device according to the exemplary embodiments may be used, for example, in any sound reproduction system that has, or can generate, a digital format of its source that is sent to the sound reproduction speakers). It should be able to generate a delay-free and a delayed version of this source, which will be sent to, respectively, the active reduction system and the amplifier of the sound reproduction system. The effect produced by the device, i.e., acoustical reduction of a known interference, is often desired in small spaces where a number of people want to listen to music, while others do not. As already mentioned above, possible scenarios include the following:

the driver in a car needs to be able to focus his/her attention to the road and the traffic sounds, even when the passenger(s) want to hear loud music;

people who want to have a conversation in a room where others are listening to loud music that is played on a stereo or television people who want to listen to their own music (using a headset) in a room where loud music is playing on a stereo or television in parties, where a DJ mixes one song after the other, the DJ wants to cancel the music that is currently playing in the room to listen to, and properly adjust the next song in a place where public radio is playing: the device can be tuned to the same station, thereby creating its own digital source of the interference. Note that it is assumed that the (processing) delay in the sound reproduction system generating the interference is larger than that of the DAC of the device in situations where the undesired interference is available via a wireless link (e.g., a sound reproduction system that transmits the reference signal)

It should be noted that the term "comprising" does not exclude other elements or features and the "a" or "an" does not exclude a plurality. Also elements described in association with different embodiments may be combined.

It should also be rioted that reference signs in the claims shall not be construed as limiting the scope of the claims.

The invention claimed is:

1. A system for processing a signal having a known interference, comprising:

a processing unit having an input terminal, a first output terminal and a second output terminal, wherein the processing unit is configured to receive the signal at the input terminal, supply the signal to the first output terminal, after a specific delay, generate a reduction signal based on the signal received at the input terminal, and supply the reduction signal to the second output terminal;

a first reproduction unit coupled to the first output terminal, wherein the first reproduction unit is configured to generate the known interference as a reference signal; and a second reproduction unit coupled to the second output terminal, wherein the second reproduction unit is configured to generate a sound representative of the reduction signal, wherein the reduction signal and the specific delay are configured for reducing the known interference at a location of the second reproduction unit, wherein the second reproduction unit is part of a headset and comprises a built-in inner microphone in each earpiece.

2. The system of claim 1, wherein, the signal is a digital signal.

3. The system of claim 1, wherein the processing unit further comprises:

a delay unit configured to delay the signal before providing the signal to the first reproduction unit.

4. The system of claim 1, wherein the processing unit is configured for Active Noise Reduction.

5. The system of claim 1, wherein the processing unit is configured for receiving the signal via a wireless link.

6. The system of claim 1, wherein the system further comprises headphones.

7. The system of claim 1, wherein the first reproduction unit is part of a speaker.

8. The system of claim 1, included in a mobile phone.

9. The system of claim 1, wherein a plurality of reference signals are used, each reference signal having a separate input.

10. A method of processing a signal having a known interference, comprising:

receiving the signal;

supplying the received signal to a first reproduction unit after a specific delay;

generating, with the first reproduction unit, the known interference as a reference signal;

generating a reduction signal based on the received signal; and supplying the reduction signal to a second reproduction unit;

generating, with the second reproduction unit, a sound representative of the reduction signal, wherein the reduction signal and the specific delay are configured for reducing the known interference at a location of the second reproduction unit, wherein the second reproduction unit is part of a headset and comprises a built-in inner microphone in each earpiece.

11. A non-transitory computer-readable medium, in which a computer program for processing a signal is stored, which computer program effects the method according to claim 10 when the computer program is executed by a processor.

12. The method of claim 10, further comprising:

playing a white noise signal to estimate an acoustical path.

13. The method of claim 10, further comprising:

playing a piece of music as the reference signal.

* * * * *